United States Patent [19]
Lau et al.

[11] Patent Number: 5,346,751
[45] Date of Patent: Sep. 13, 1994

[54] ELECTRONIC PACKAGE USING CLOSED PORE COMPOSITES

[75] Inventors: John W. Lau, Gaithersburg; Jack H. Enloe, Columbia, both of Md.

[73] Assignee: W. R. Grace & Co.-Conn., New York, N.Y.

[21] Appl. No.: 699,854

[22] Filed: May 14, 1991

Related U.S. Application Data

[63] Continuation-in-part of Ser. No. 588,799, Sep. 27, 1990, Pat. No. 5,102,749, which is a continuation of Ser. No. 286,557, Dec. 19, 1988, Pat. No. 5,017,034.

[51] Int. Cl.$^5$ .................... C04B 35/52; H05K 1/03
[52] U.S. Cl. .................... 428/210; 428/209; 428/313.3; 428/314.4; 428/319.1; 428/432; 428/433; 428/469; 428/472; 428/698; 428/701; 428/704; 428/901
[58] Field of Search ............ 428/426, 313.3, 314.4, 428/319.1, 209, 210, 212, 432, 433, 469, 472, 698, 701, 704, 901; 174/68.5

[56] References Cited

U.S. PATENT DOCUMENTS

| | | | |
|---|---|---|---|
| 4,134,848 | 1/1979 | Adicoff et al. | 252/63.2 |
| 4,313,026 | 1/1982 | Yamada et al. | 174/68.5 |
| 4,403,107 | 9/1983 | Hoffman | 428/313.3 |
| 4,659,611 | 4/1987 | Iwase et al. | 428/698 |
| 4,849,380 | 7/1989 | Sawhill | 501/20 |
| 4,865,875 | 9/1989 | Kellerman | 427/96 |
| 4,867,935 | 9/1989 | Morrison, Jr. | 264/61 |
| 5,017,434 | 5/1991 | Enloe et al. | 428/428 |
| 5,098,781 | 3/1992 | Minnick et al. | 428/313.3 |

FOREIGN PATENT DOCUMENTS

| | | |
|---|---|---|
| 0253342 | 1/1988 | European Pat. Off. |
| 0064545 | 4/1984 | Japan. |

OTHER PUBLICATIONS

Ceramic Source, vol. 8, 1992 (ACerS) p. TD 29.

*Primary Examiner*—A. A. Turner
*Attorney, Agent, or Firm*—Steven Capella

[57] ABSTRACT

The electronic packages of the invention all employ the general materials scheme of a low dielectric constant material (low K material) mounted on a dense, high thermal conductivity (high TC) ceramic base. In this way, the low K material provides the signal transmission paths to and from the I.C. chips housed in the package and thus allows for higher signal transmission speed. The high TC material allows for heat dissipation out of the package. The dense base and/or the low K material may contain metallization in any desired pattern. The low K material is preferably a composite of closed pores in a glass-containing matrix.

13 Claims, 7 Drawing Sheets

ELECTRONIC PACKAGE USING CLOSED PORE COMPOSITES

This application is a continuation-in-part of U.S. patent application Ser. No. 588,799, filed Sep. 27, 1990, now U.S. Pat. No. 5,102,749 which is a continuation of U.S. patent application Ser. No. 286,557, filed Dec. 19, 1988, now U.S. Pat. No. 5,017,034. The disclosures of those applications are incorporated herein by reference.

BACKGROUND OF THE INVENTION

In the fields of electronics and microelectronics, there is an ever present desire and need for materials with improved electrical characteristics. Design trends in microelectronics have led to the use of larger integrated circuit chips. Additionally, the density of circuitry on the chips has increased the power dissipated by the chips. These trends have been limited by the available electronic packaging used to house the chips and have led to a demand for improved electronic packaging.

The improved performance demanded of electronic packaging (and the materials systems making up the packaging) is multi-faceted. The package should be able to dissipate heat generated by the chips contained therein. The package should allow transmission by multiple electrical circuits between the chips to the package exterior. The package should allow transmission of high speed electrical signals within and between the chips held in the package. The package should have good thermal expansion match with the chips (usually silicon-based) to withstand thermal cycling without excessive stress buildup. The package should be able to adequately protect the chips from the outside environment. Further, the package should be able to maintain its own performance in the operating environment over time.

Two properties of the package which limit I.C. chip design are the thermal conductivity and the dielectric constant of the package. Larger, higher density, higher speed I.C. designs use more power and generate a greater amount of ohmic heat. I.C. performance degrades at high temperatures. Therefore, improved ability of the package to dissipate heat is essential to the reliable operation of high power designs. The packages ability to dissipate heat is directly related to the thermal conductivity of materials forming the package as well as the package design.

Low dielectric constant materials are particularly important with regard to the speed of electrical signal propagation for the I.C. chips in the package. Lower dielectric constant materials allow higher propagation speeds. Higher propagation speed is very desirable since it effectively increases the capability of the chips to process signals more quickly.

In the past, various materials systems and package designs have been employed to meet electronic packaging demands. Typically, those packages either had good thermal conductivity or low dielectric constant, but not both.

In U.S. Pat. No. 4,865,875 to Kellerman, a composition containing organic binder, ceramic or glass ceramic particles, and a plurality of hollow glass microspheres was applied as a thick film on an alumina substrate. The composition was subsequently fired to yield a material having a dielectric constant of about 3.5–4.5. While this package has a low dielectric constant material, the package has poor thermal conductivity. Additionally, the thick film process used in Kellerman is potentially costly and difficult to control.

U.S. Pat. No. 4,867,935 to Morrison discloses the formation of multilayer structures from green sheets containing glass microspheres and glass particles. The green sheets are pressureless sintered to form a hermetic body. Morrison uses this low dielectric constant composite material to form the entire package base. The lowest dielectric constant reported by Morrison was 3.25 at 1 MHz using a 40 vol. % loading of microspheres. The Morrison package unfortunately also has very poor thermal conductivity.

Thus, there remains a need for improved electronic packaging having both low dielectric constant and high thermal conductivity.

SUMMARY OF THE INVENTION

The invention provides electronic packaging which meets the need for improved overall performance. The invention also provides techniques for producing such packages using glass microspheres.

In one aspect, the invention encompasses an electronic package comprising a high thermal conductivity substrate and a first low dielectric constant (low K) layer laminated onto the substrate, a first side of the low K layer and the substrate defining a layer-substrate interface, and the low K layer comprising a low K composite of closed pores in a glass-containing matrix.

The package may contain multiple layers of the composite. Additionally, the low K composite layer(s) may contain metallization on portions of their surface or through portions of the layer thickness. The glass preferably has a low enough glass transition temperature to allow densification at 1000° C. or less. Preferably, the low K composite contains little or no open porosity. Preferably, the low K composite is capable of acting as a hermetic barrier, however, the invention also encompasses non-hermetic embodiments as well. High conductivity metallization such as copper, gold or silver may be cofired with the low K composite.

In a more specific embodiment, the low K composite layer or layers may define a cavity extending from the interface between the composite and the substrate. The cavity could be used as the location for microelectronic components such as high density multichip interconnects (a group of interconnected chips).

In a further aspect, the invention encompasses using high thermal conductivity aluminum nitride substrates in combination with the low K closed pore composite.

The invention also encompasses electronic packages having a low dielectric constant layer wherein the dielectric constant of the low K layer is about 4.0 or less, preferably about 3.0 or less, more preferably about 2.5–3.0.

In another aspect, the invention encompasses a method of forming an electronic package comprising a low dielectric constant (low K) layer laminated onto a high thermal conductivity substrate, the method comprising:

a) providing a dense, high thermal conductivity substrate, b) laminating a green low K layer onto the substrate to form a laminate, the green low K layer containing glass microspheres and a binder, and c) hot pressing the laminate to densify the green layer.

The green low K layers and/or the substrate may be metallized prior to hot pressing. Additionally, sections of said green layers may contain unsinterable regions, the unsinterable regions being removed after hot pressing to form a cavity in the low K layer.

These and other aspects of the invention are discussed further below.

DETAILED DESCRIPTION OF THE INVENTION

Figure 1:
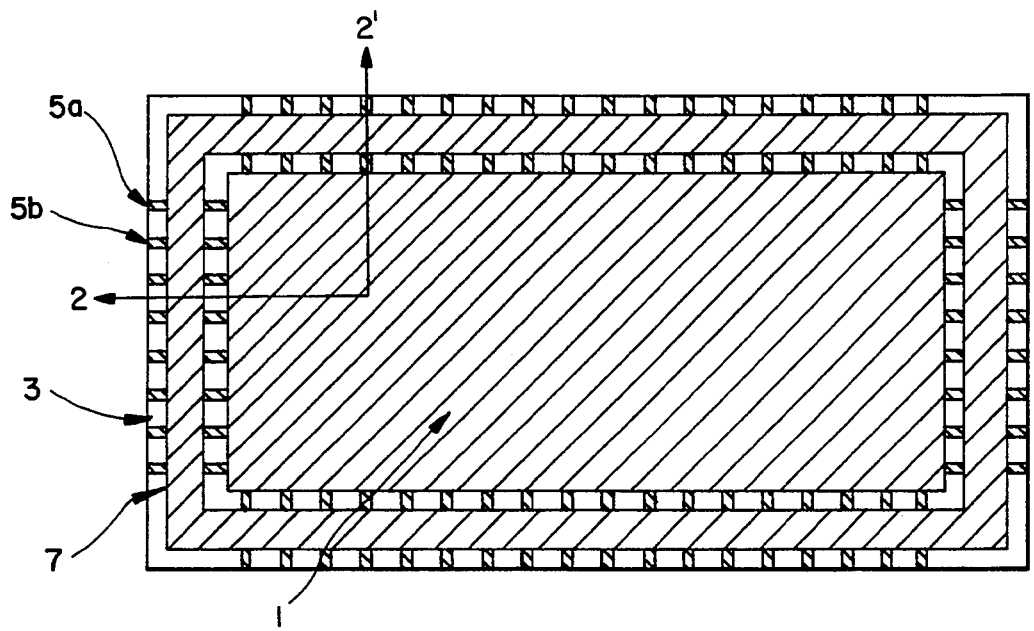
FIG. 1 is a plan view of an electronic package encompassed by the invention.

The electronic packages of the invention all employ the general materials scheme of a low dielectric constant material (low K material) mounted on a dense, high thermal conductivity (high TC) ceramic base. The low K material provides the signal transmission paths to and from the I.C. chips thus allowing for higher signal transmission speed. The high TC material acts as a base on which the I.C. chip(s) are directly mounted or indirectly mounted (the chips being mounted on an intermediate support, e.g. a silicon support structure, which is itself mounted on the base) allowing for effective heat transfer out of the package.

This general materials scheme can be used in various physical configurations. A preferred configuration is a cavity laminate wherein a low K layer(s) contains at least one cavity which may extend from the high TC base through the low K layer(s). The low K material defines the cavity walls. The cavity may be used to house the chip(s) to be held by the package. The floor of the cavity is preferably defined by the dense high TC base.

The dense base and/or the low K layer(s) may contain metallization in any desired pattern.

The preferred material used as the low K layer(s) is a composite of closed pores in a glass-containing matrix. The glass may be any glass (or combination of glasses) having a relatively low dielectric constant (i.e., less than that of the high TC base). Additionally, the glass(es) should have a low enough glass transition temperature ($T_g$) so that it can be densified by hot pressing at less than 1000° C. Preferably, at least a portion of the glass is provided by hollow glass microspheres contained in the green low K layer(s). $T_g$ should also be low enough so densification can take place without significant loss of the closed porosity of the microspheres.

The glass(es) should also be compatible with the high TC base in thermal expansion properties so as to minimize residual stresses caused by temperature changes during processing or actual use of the package. Large residual stresses due to poor thermal expansion matching can lead to mechanical failure by cracking and/or delamination.

While the invention is not limited to any particular glass composition, substantially alkali-free or ultra-low alkali glasses are preferred. Examples of such glass compositions are disclosed in U.S. Pat. No. 5,017,034 the disclosure of which is incorporated herein by reference. If desired, a combination of different glass compositions may be employed (e.g. glass microspheres of one composition with glass particles of another composition).

The closed pores of the low K composite layer are preferably formed (at least in part) by using hollow glass microspheres as a component of the green low K layer. In some embodiments, the green low K layer may just contain glass microspheres and binder. Alternatively, the low K green layer may contain additional glass in powder form. A particulate filler material (e.g. AlN, $Al_2O_3$, etc.) may also be added to the green layer (e.g. to enhance thermal conductivity). Such a filler would then be present in the densified low K layer.

The green low K layer preferably contains a volatilizable binder which can be removed from the laminate during heating without leaving undesired residue. Polyolefins are the preferred binders, polyethylene being most preferred. Methods of forming green sheets by extrusion disclosed in U.S. Pat. No. 4,920,640 may be used to form the green low K layers for the process of the invention.

The microspheres and any glass or filler particles used preferably have particle sizes of about 0.1 to 20 microns. Practically, the loading of microspheres achievable in the green low K layer is generally about 55–60 vol. % for typical distributions of microsphere sizes.

The total closed pore volume in the fired low K layer is dependent on several factors such as the volume loading of microspheres, the microsphere wall thickness, the degree of densification of the green layer during firing, and the presence of any blowing agents in the green layer. High pore closed volume (e.g. 40–60 vol. %) is preferred since the dielectric constant decreases with increased pore volume. If the percentage of pore volume is too great, however, the strength of the low K layer may become inadequate. Excess pore volume may result in the formation of open porosity. Open porosity is generally undesirable since it may allow contaminants such as water to penetrate through to the chips contained in the package. Also, water infiltration would increase the dielectric loss of the low K material itself.

The high thermal conductivity dense ceramic base typically has a significantly higher thermal conductivity than low K layer. A preferred base material is aluminum nitride (AlN) such as described in U.S. Pat. No. 4,920,640 to Enloe et al. AlN has a high thermal conductivity (i.e., at least about 0.70–2.50 W/cm K). While other base materials can be used, AlN is preferred because of its very high thermal conductivity and its good thermal expansion match with silicon (frequently used as an interconnection substrate for I.C. chips).

The dense base, such as an AlN base, may be formed using the techniques described in U.S. Pat. No. 4,920,640 and U.S. patent application Ser. No. 631,577, filed Dec. 21, 1990, incorporated herein by reference.

The base may contain metallization in various forms such as vias, ground planes, connecting lines, etc. Any known suitable metallization may be used. The low K layer(s) may also contain metallization in various configurations useful in electronic packaging. Additionally, there may be metallization on the base surface that interfaces with the low K layer(s) or other material intervening between the base and the low K layer(s).

The metallization used within the base typically contains one or more refractory metals. The metallization in the low K layer(s) preferably contains copper, gold, silver or other highly conductive metal that densifies under the conditions used to densify the low K layer(s). The metallization at the base surface may be either refractory metallization or more conductive metallization or both, depending on whether the metallization is cofired with base or not.

Preferred methods for producing closed pore composite-containing packages involve the following basic steps:

a) providing a dense, high TC base;

b) laminating a green low K layer onto the base, the green low K layer containing hollow microspheres and a binder; and c) hot pressing the laminate to densify the green low K layer, forming the low K closed pore composite/high TC base package.

The high TC base can be provided by any known method. For AlN, the base can be made using the methods discussed in U.S. Pat. No. 4,920,640 and more preferably U.S. patent application Ser. No. 631,577. While a non-flat base could be used, flat bases are generally preferred. As noted above, the base may contain metallization provided using known methods. Additionally, patterns or layers of metallization may be applied to the surface of the dense base before lamination with the microsphere-containing green layer(s).

Cavity structures can be produced in the manner described in U.S. patent application Ser. No. 286,557. Namely, the low K material that is to define the cavity walls is formed into a green layer as described above. The region(s) defining the cavity(ies) is then cut out of the layer. The cut out region is then replaced with a material which does not sinter under the hot pressing conditions to be used in step c) above.

The replacement material is preferably in the form of a preform sheet. While BN sheets (as described in U.S. Pat. No. 4,920,640) are used in the discussion below, any material that does not sinter under the conditions for hot pressing the low K composite or otherwise adversely affect the properties of the package can be used. BN sheets are preferred because they are known to be compatible with the other materials in the preform. Once the laminate has been assembled with the various layers and hot pressing is performed, the binder leaves the unsinterable regions of the various layers. The remaining unsintered powder can easily be removed by brushing, washing or very light grit blasting on completion of hot pressing.

Prior to hot pressing, metallization may be applied to the surface of the green low K layer(s) or may be placed into the green low K layers using conventional metallization techniques. In this way, conductor lines, vias and the like can be established in the closed pore composite.

Multiple green low K layers may be laminated onto the base. Any or all of the layers can be metallized. All the laminated layers may then be simultaneously hot pressed in a single firing to produce the desired package.

A lamination step may be used prior to hot pressing to assure proper registration of the layers and to minimize contamination. For polyethylene binder systems, lamination conditions of 110° C. and 200 psi pressure may be used. The hot pressing is preferably performed at about 600°–1000° C., depending on the glass used. The pressure may be about 300–1000 psi. Nitrogen gas is the preferred atmosphere. Hot pressing times may vary, with 1–2 hours being typical.

The method of the invention will be described below in connection with the drawings which show the production of a package having a cavity defined by the closed pore composite and the dense base. The method for producing such a package involves the "replica" technique which was also described in U.S. patent application Ser. No. 286,557. It should be understood that a flat package could also be produced according to the invention with or without use of replica technique. In other words, a flat package could be produced by simple lamination. Further, the replica technique need not be used if uniform density is not a concern.

The problem solved by the replica technique is that when a particular layer to be densified is not of uniform composition from region to region, the different regions will undergo differing amounts of uniaxial shrinkage in the hot press as they densify. If the replica technique is not used, then the region that undergoes the lesser amount of shrinkage to reach full density will hinder the platen or pressure plate (or spacer) from exerting further pressure on the region that still has to undergo further densification. Thus, the region requiring greater shrinkage may not fully or uniformly densify due to lack of applied pressure.

The replica technique overcomes this problem by providing additional layers of material that cancel out the shrinkage differential between regions of a layer or layers. In this way, the net uniaxial shrinkage to achieve maximum density at a given pressure and temperature is substantially the same across the entire cross section of the laminate, and the pressure in one region of the laminate is not stopped because another region reached maximum density first.

While the following discussion and the drawings illustrate a particular package design, it should be understood that the invention is not limited to any particular package design or configuration of layers.

Referring to the Figures in detail:

In FIG. 1, a densified AlN base with metallization is shown at 1. A densified closed pore-glass composite layer is shown as a lead frame 3 bonded to AlN layer 1. A plurality of leads 5a, 5b, etc., is shown on lead frame 3. A metallized seal ring 7, also of densified closed pore-glass composite, is bonded to frame 3.

Figure 3:
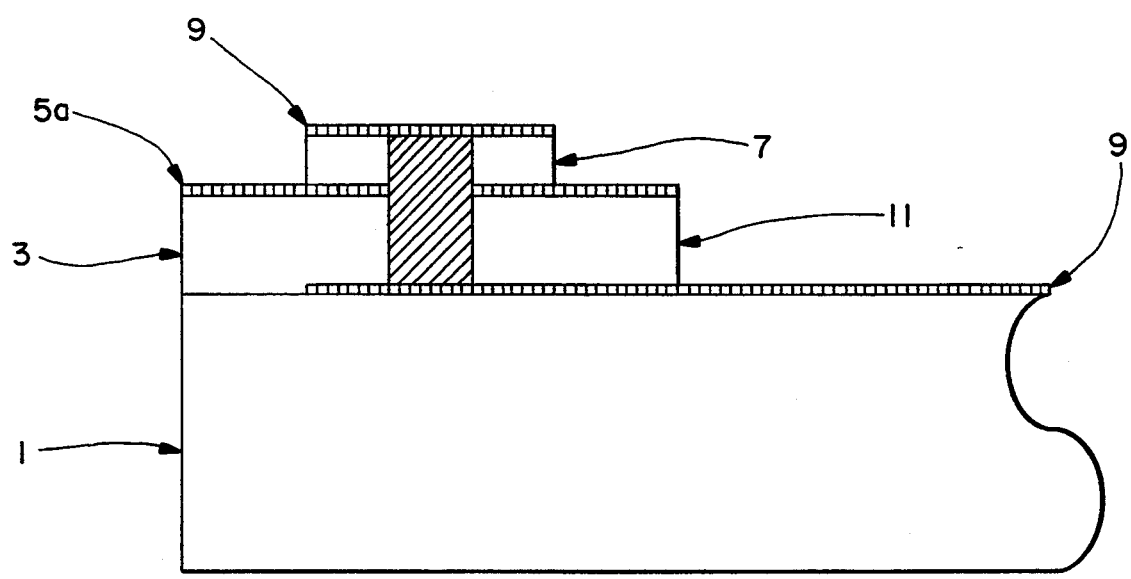
FIG. 3 is a magnified perspective view in section of FIG. 2 taken along the line 3-3', to show a via and metallization.

In FIG. 3 a via is shown at 11 with metallization (magnified) at 9.

Figure 2:
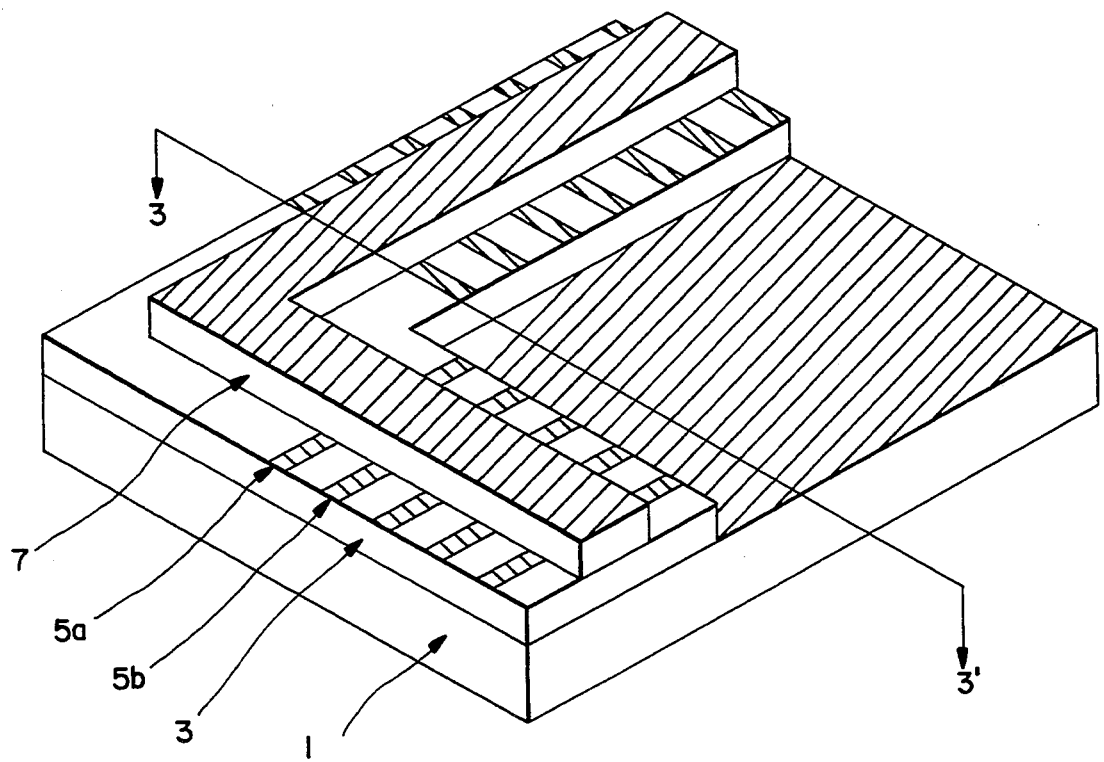
FIG. 2 is a magnified perspective view of a corner of the package of FIG. 1 taken along the line 2—2'.

FIGS. 4–12 show individual layers and final assembly of a greenware laminate for hot pressing, to make the package of FIGS. 1–3, using our preferred replica technique.

Figure 4:
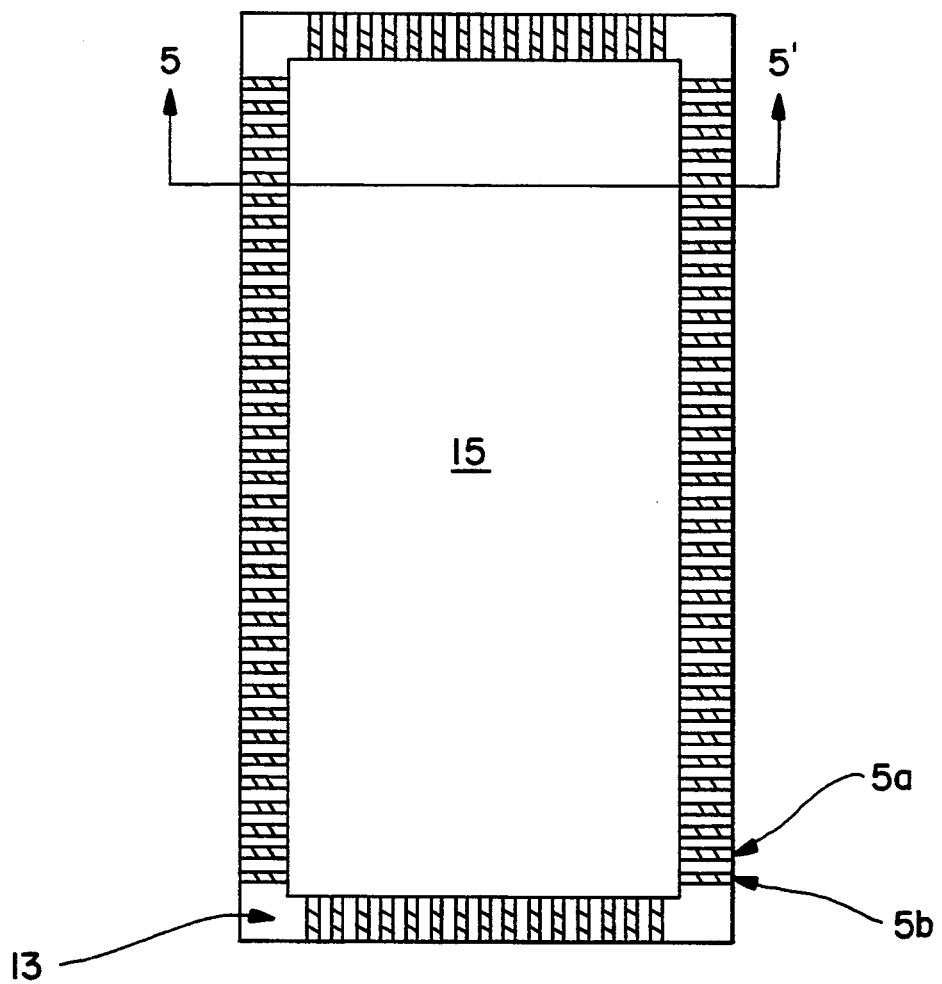
FIG. 4 is a plan view of a greenware lead frame.

In FIG. 4 a screen-printed greenware lead frame layer is shown at 13, with leads 5a, 5b, etc. This frame 13 is a microsphere-containing green low K layer. It encloses a greenware sheet (plug) of BN, 15.

Figure 5:
FIG. 5 is a section of the lead frame of FIG. 4 taken along the line 5—5'.
Figure 6:
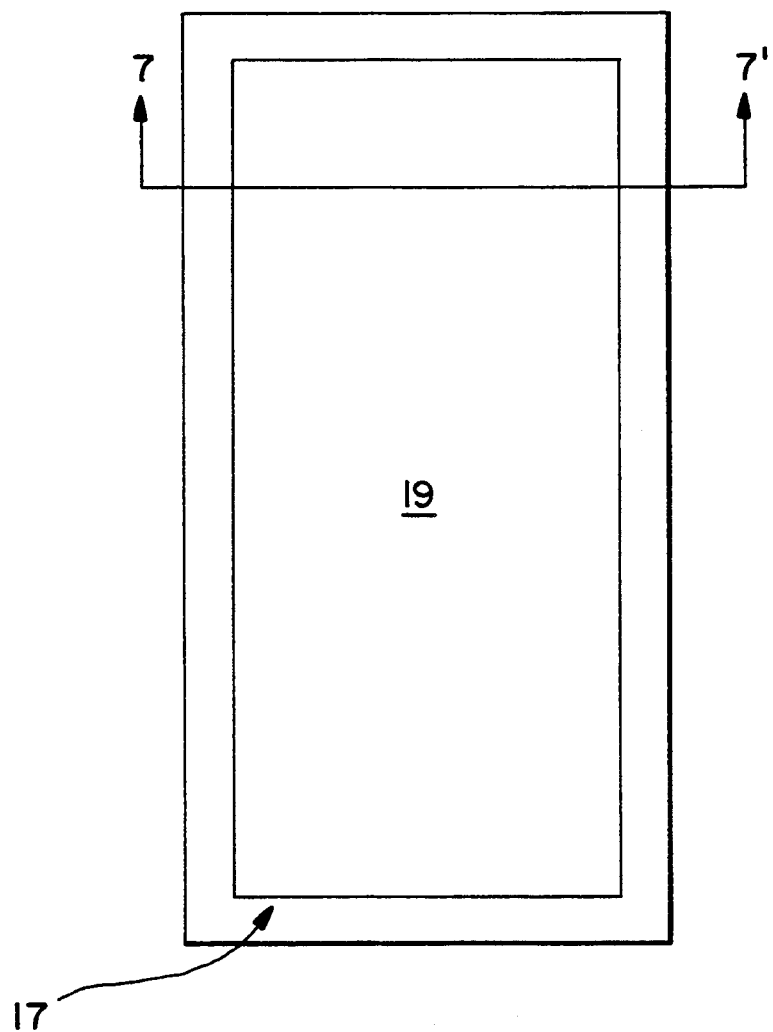
FIG. 6 is a plan view of a replicate for the lead frame of FIG. 4.
Figure 7:
FIG. 7 is a section of the replicate of FIG. 6 taken along the line 7—7'.

FIG. 6 shows a replica for the greenware lead frame of FIG. 5, consisting of a greenware sheet (frame) of BN 17 enclosing a microsphere-containing green low K layer (plug) 19.

Figure 8:
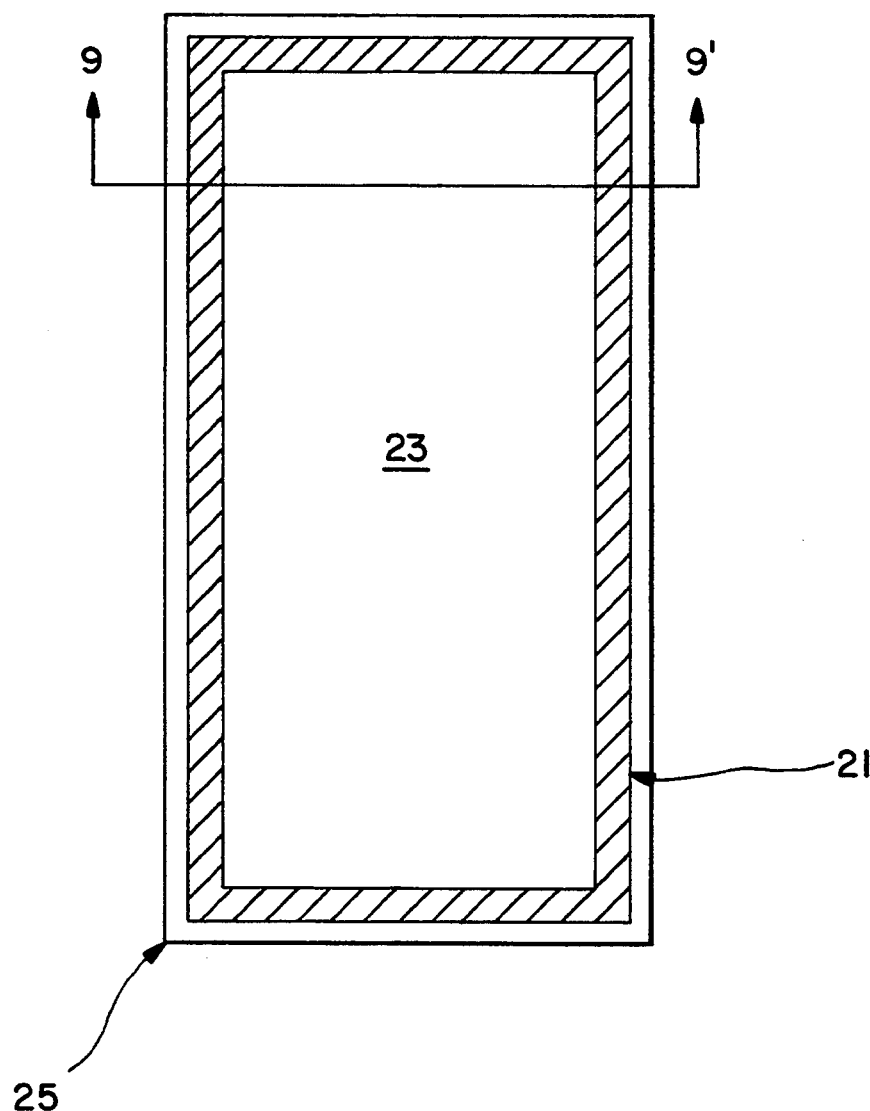
FIG. 8 is a plan view of a metallized greenware seal ring layer.
Figure 9:
FIG. 9 is a section of the seal ring layer of FIG. 8 taken along the line 9—9'.

FIG. 8 shows a microsphere-containing metallized green low K seal ring layer 21. This seal ring 21 encloses BN greenware plug 23 and is surrounded by BN greenware sheet (outside ring) 25.

Figure 10:
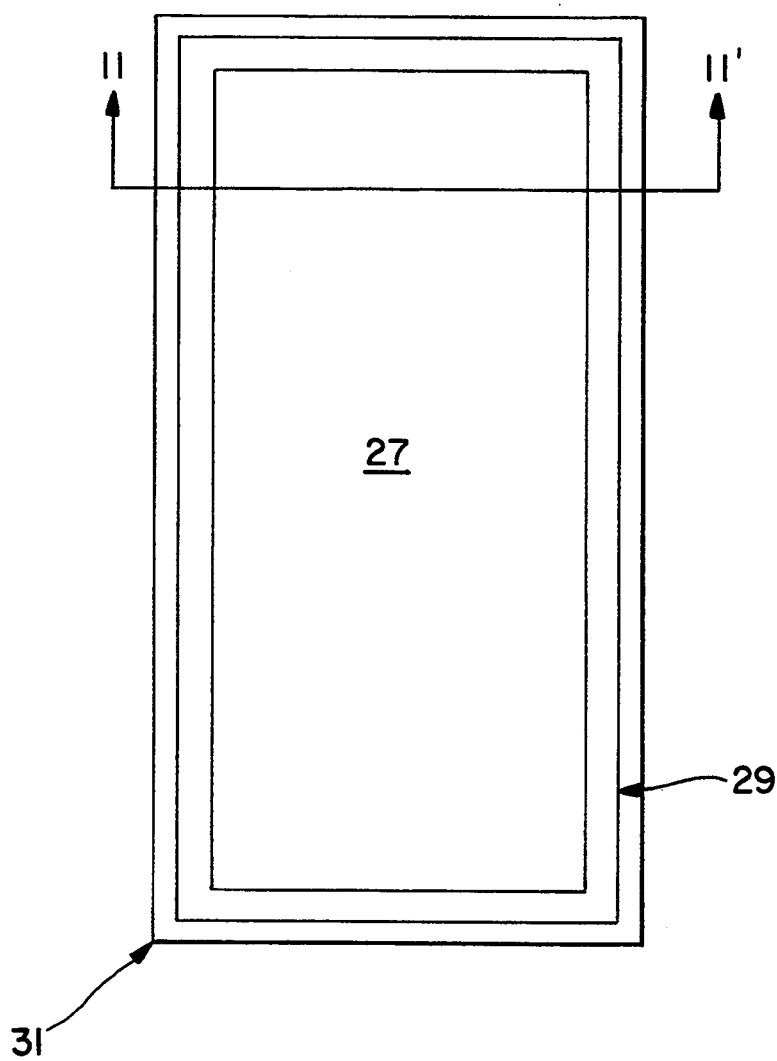
FIG. 10 is a plan view of a replicate for the seal ring layer of FIG. 8.
Figure 11:
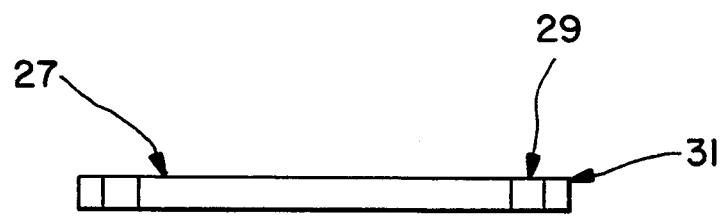
FIG. 11 is a section of the replicate of FIG. 10 taken along the line 11—11'.

FIG. 10, the replica of FIG. 8, shows a microsphere-containing green low K layer (plug) at 27, enclosed by a ring of BN greenware 29, which is in turn enclosed by a ring of a microsphere-containing green low K layer 31.

Figure 12:
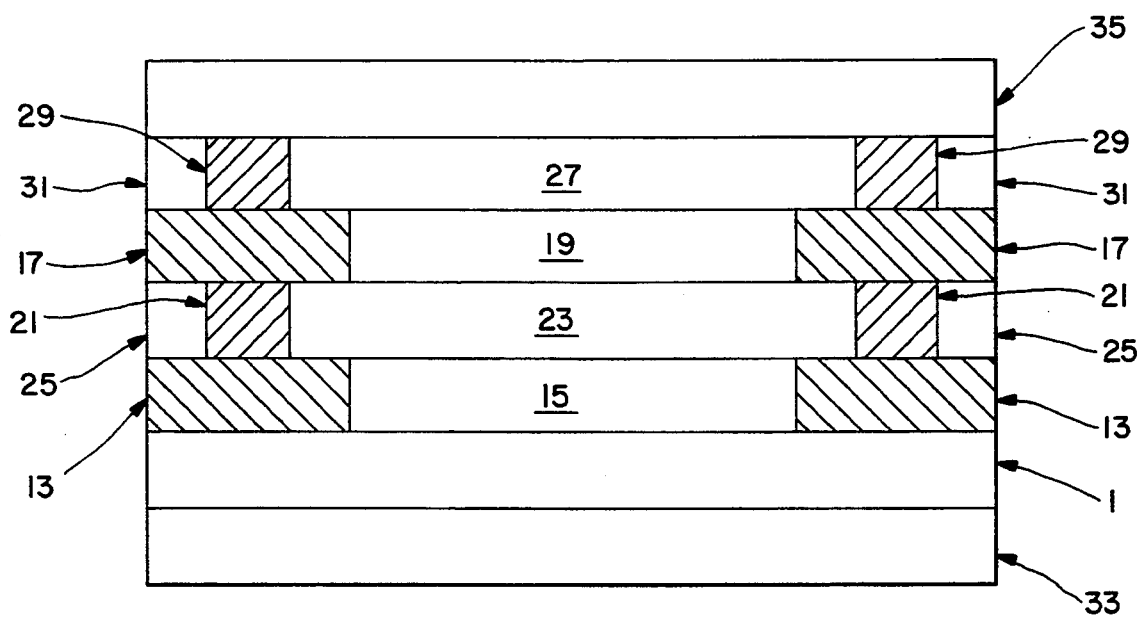
FIG. 12 is a schematic representation in section of a greenware laminate of the invention, with replicant layers. Vertical scale is exaggerated.

FIG. 12 shows a bonded, replicate laminate, comprising all the layers described in FIGS. 4-11, assembled for hot pressing. Additionally, at 33 is shown a layer of BN greenware. This is optional, and may be used at high hot pressing temperatures to minimize reaction with graphite dies. An overlayer of BN greenware at 35 completes the laminate assembly. As with layer 33, layer 35 is also optional. Additionally, other suitable materials may be used in place of the protective BN sheets.

The replica technique principle is illustrated in FIG. 12. There the differential in shrinkage between BN region 15 and microsphere-containing region 13 is cancelled out by the differential shrinkage of BN region 17 and microsphere-containing region 19 in the replica layer above. Similar cancellation occurs between regions 25 and 31, regions 23 and 27, and regions 21 and 29. Thus, the stack of regions in the direction of hot pressing includes 4 BN layers, 2 microsphere-containing layers and the dense AlN base layer at all points across the pressure plate.

It is important that the preform has a good fit with the hot press die cavity since gaps at the die wall preform interface can result in substantial unwanted flow of material. Preforms can be hot pressed individually or in stacks separated by BN sheets (or other suitable material) and/or graphite spacers. Hot pressing conditions depend on those required to densify the green low K layer(s). For the microsphere-containing composite, temperatures in the range of approximately 600°–1000° C. and pressures between 500 and 1000 psi for approximately 1 to 2 hours have been shown to be suitable for densification. After hot pressing under these conditions, the replica pieces are easily removed from the top of the package and the undensified BN is removed from the package surfaces by washing and/or light grit blasting. In some instances, some minor machining of the package edges has been necessary to improve the overall package performance.

Lastly, it should be understood that the method of the invention is not limited to any particular hot press tooling configuration.

What is claimed is:

1. An electronic package comprising a thermally conductive substrate, having a thermal conductivity of at least about 0.70 W/cm-k, and a first low dielectric constant layer, having a dielectric constant of about 3.0 or less, laminated onto said substrate, a first side of said layer and said substrate defining a layer-substrate interface, and said layer comprising a closed pore composite of 55–60 vol. % hollow glass microspheres in a glass containing matrix.

2. The package of claim 1 wherein said layer contains a cavity extending from said interface through the entire thickness of the layer, said layer defining the walls of the cavity and said thermally conductive substrate defining the floor of the cavity.

3. The package of claim 2 wherein said substrate contains metallization.

4. The package of claim 3 having metallization at portions of said interface.

5. The package of claim 4 further comprising an additional layer of said low dielectric constant composite laminated on a second side of said first layer, said cavity extending through said second layer.

6. The package of claim 5 wherein metallization is present at portions of a layer-layer interface formed between said layers.

7. The package of claim 6 having metallization on a side of said additional layer not forming part of said layer-layer interface.

8. The package of claim 1 wherein said substrate contains metallization.

9. The package of claim 8 having metallization at portions of said interface.

10. The package of claim 9 wherein said layer contains metallization on a second side of said layer.

11. The package of claim 10 further comprising an additional layer of said low dielectric constant composite laminated on the second side of said first layer.

12. The package of claim 11 wherein a second side of said additional layer contains metallization.

13. The package of claim 1 wherein said substrate contains aluminum nitride.

* * * * *